United States Patent
Robinson

(10) Patent No.: US 6,174,780 B1
(45) Date of Patent: Jan. 16, 2001

(54) METHOD OF PREPARING INTEGRATED CIRCUIT DEVICES CONTAINING ISOLATED DIELECTRIC MATERIAL

(75) Inventor: Karl M. Robinson, Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/139,918

(22) Filed: Aug. 26, 1998

Related U.S. Application Data

(62) Division of application No. 08/631,638, filed on Apr. 8, 1996.

(51) Int. Cl.[7] .................................................. H01L 21/20
(52) U.S. Cl. .......................................................... 438/396
(58) Field of Search ............................. 257/40, 310, 532, 257/298, 303, 535; 438/99, 383, 396; 361/301.4, 303, 305, 311, 312, 313, 321.1, 321.5, 323, 308.2

(56) References Cited

U.S. PATENT DOCUMENTS

| | | | |
|---|---|---|---|
| 4,695,921 | * 9/1987 | Robbins | 361/308 |
| 5,039,589 | * 8/1991 | Takahashi | 430/138 |
| 5,097,381 | 3/1992 | Vo . | |
| 5,155,057 | 10/1992 | Dennison et al. . | |
| 5,196,364 | 3/1993 | Fazan et al. . | |
| 5,321,649 | 6/1994 | Lee et al. . | |
| 5,381,302 | 1/1995 | Sandhu et al. . | |
| 5,392,189 | 2/1995 | Fazan et al. . | |
| 5,396,094 | 3/1995 | Matsuo . | |
| 5,412,144 | * 5/1995 | Stupp et al. | 558/406 |
| 5,418,388 | 5/1995 | Okudaira et al. . | |
| 5,438,011 | 8/1995 | Blalock et al. . | |
| 5,442,197 | 8/1995 | Andrieu et al. . | |
| 5,547,748 | * 8/1996 | Ruoff et al. | 428/323 |
| 5,650,646 | 7/1997 | Summerfelt . | |
| 5,744,399 | * 4/1998 | Rostoker et al. | 438/622 |

OTHER PUBLICATIONS

Curl, "Formation and Chemistry of the Fullerenes," *Applied Superconductivity*, 1(7–9), 869–878 (1993).

Dewa et al., "The Study of Metal–Insulator–Semiconductor Structures with Langmuir–Blodgett Insulators," *Thin Solid Films*, 132,27–32 (1985).

Kanetake et al., "Photo– and Thermo–Chromism in Vacuum–Deposited Polydiacetylene Films," *Solid State Communications*, 56(9), 803–807 (1985).

Long et al., "$C_{60}$–$C^+_{60}$ collisions: Semiempirical molecular dynamics simulations," *J. Chem. Phys.*, 100(10), 7223–7228 (1994).

Nagpal et al., "Novel thin films of titanium dioxide particles synthesized by a solgel process," *J. Mater. Res.*, 10(12), 3068–3078 (1995).

Nagagawara et al., "Effects of buffer layers in epitaxial growth of $SrTiO_3$ thin film on Si(100)," *J. Appl. Phys.*, 78(12), 7226–7230 (1995).

Shibata et al., "Electrical Properties of MIM and MIS structures with Langmuir–Blodgett Polydiacetylene Films," *Proceedings of the Twenty–First Symposium on Electrical Insulating Materials*, 247–250 (1988).

Wang et al., "Interactions between the interface of titanium and fullerene," *J. Appl. Phys.*, 79(1), 149–152 (1996).

Zhang et al., "Electronic structures of the alkali–containing buckminsterfullerenes ($A\partial C_{60}$) (A=Li, Na, K, Rb. Cs) and the halogen–containing buckminsterfullerenes ($H\partial C_{60}$) (H=F, Cl, Br, I)," *J. of Molecular Structure (Theochem)*, 282, 187–191 (1993).

* cited by examiner

Primary Examiner—Olik Chaudhuri
Assistant Examiner—Douglas A. Wille
(74) Attorney, Agent, or Firm—Mueting, Raasch & Gebhardt, P.A.

(57) ABSTRACT

A capacitor comprising a first electrode, a second electrode, and a dielectric material and an organic isolation matrix forming at least one layer between the first and second electrodes is provided. Also provided are other integrated circuit devices containing a dielectric material and an organic isolation matrix in contact with the dielectric material.

13 Claims, 1 Drawing Sheet

METHOD OF PREPARING INTEGRATED CIRCUIT DEVICES CONTAINING ISOLATED DIELECTRIC MATERIAL

This is a division of application Ser. No. 08/631,638, filed Apr. 8, 1996, (pending), which is incorporated herein by reference.

FIELD OF THE INVENTION

This invention relates to integrated circuit structures (i.e., devices), particularly capacitor structures used in random access memory devices on integrated circuits.

BACKGROUND OF THE INVENTION

Capacitors are the basic energy storage devices in random access memory devices, such as dynamic random access memory (DRAM) devices, static random access memory (SRAM) devices, and ferroelectric random access memory (FeRAM) devices. Capacitors store electric charge; a charged capacitor is represented by a 1 and a discharged capacitor by a 0. They consist of two conductors, such as parallel metal or polysilicon plates, which act as the electrodes (i.e., the storage node electrode and the cell plate capacitor electrode), insulated from each other by a dielectric material.

As memory devices increase in memory cell (i.e., storage cell or storage node) density, it is necessary to decrease the size of circuit components, such as capacitors. Thus, there is a continuing challenge to maintain sufficiently high storage capacitance while decreasing cell area. It is desirable that each capacitor possess as much capacitance as possible. Preferably, they should possess at least about $20 \times 10^{-15}$ farads, and more preferably, at least about $60 \times 10^{-15}$ farads, of charge storage capacity. If a capacitor exhibits too little capacitance, it will lose charge placed upon it too rapidly, thereby causing errors in data storage.

The capacitance of a capacitor is dependent upon the dielectric constant of the material placed between the plates of the capacitor, the distance between the plates, and the effective area of the plates. One way to retain (or even increase) the storage capacity of a random access memory device and decrease its size is to increase the dielectric constant of the dielectric layer of the storage cell capacitor. For example, in order to achieve the charge storage efficiency in 256 megabit (Mb) memories and above, materials having a high dielectric constant, typically greater than about 10, can be used as the dielectric layer between the two electrodes. The dielectric constant is a value characteristic of a material and is proportional to the amount of charge that can be stored in the material when it is interposed between two electrodes. It is the ratio of the capacitance of a capacitor filled with a given dielectric material to that of the same capacitor having only a vacuum as the dielectric.

Examples of high dielectric constant materials are metal oxides such as $TiO_2$, $WO_2$, $Ta_2O_4$, $Ta_2O_5$, and $Al_2O_3$. These materials have dielectric constants above 10. Metal oxides and metal salts such as $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$ have even higher dielectric constants. These materials have dielectric constants above 50. By comparison, $Si_3N_4$ and $SiO_2/Si_3N_4$ composite films, which are often used in 256 kilobits (Kb) to 64 megabits (Mb) generations of DRAMs, have dielectric constant values of 7 or less.

Unfortunately, high dielectric constant materials are generally incompatible with existing chip manufacturing processes and cannot be simply deposited on a polysilicon electrode as is the case for the lower dielectric constant materials, such as $Si_3N_4$ and $SiO_2/Si_3N_4$ composite layers. For example, these high dielectric materials often form pinholes upon deposition. This incompatibility is believed to be a result of the oxygen rich atmosphere present during the deposition and/or during annealing steps. The $O_2$ oxidizes portions of the materials used for the storage node plate. Also, the capacitors employing standard storage node plate materials undergo physical degradation during thermal cycles due to the diffusion of the cell plate material into the dielectric material.

One means by which these problems can be overcome, at least in part, is through the use of a storage node electrode that consists of a layer of nonoxidizing conductive material such as platinum overlying a barrier layer made of tantalum or titanium nitride, for example, which overlies a conductive plug such as a polysilicon plug. See, U.S. Pat. No. 5,392,189 (Fazan et al.). Although this is an effective technique, other techniques are needed that allow for the effective use of high dielectric materials in integrated circuits.

SUMMARY OF THE INVENTION

The present invention is directed to capacitors, particularly to thin film capacitors used in integrated circuits. These capacitors include a first electrode (i.e., also referred to herein as an electrode plate), a second electrode, and a dielectric material and an organic isolation matrix forming at least one layer between the first and second electrodes. The organic isolation matrix can be formed from a variety of organic materials, such as a soluble polymer, a two-dimensional polymer, or a fullerene. The isolation matrix can be in the form of layers on either side of a layer of the dielectric material, or it can completely surround and encapsulate the dielectric material. In either situation, the dielectric material and organic isolation matrix together preferably form a film of less than about 1000 Å.

The present invention also provides a method of preparing a capacitor comprising: depositing a first material to form a first electrode; depositing a dielectric material and an organic isolation matrix on the first electrode; and depositing a second material to form a second electrode such that the dielectric material and the organic isolation matrix form at least one layer between the first and second electrodes and the organic isolation matrix isolates the dielectric material from the first and second electrodes.

Although the present invention is primarily directed to capacitors, the organic isolation matrix can also be used to isolate any dielectric material used in an integrated circuit. For example, the dielectric material can be the gate dielectric of a field effect transistor device. Thus, the present invention provides an integrated circuit device comprising a dielectric material and an organic isolation matrix in contact with the dielectric material, as well as a method of preparing such an integrated circuit device. The method includes a step of depositing a dielectric material and an organic isolation matrix in contact with the dielectric material such that the dielectric material is isolated by the organic isolation matrix.

DETAILED DESCRIPTION

Figure 1:
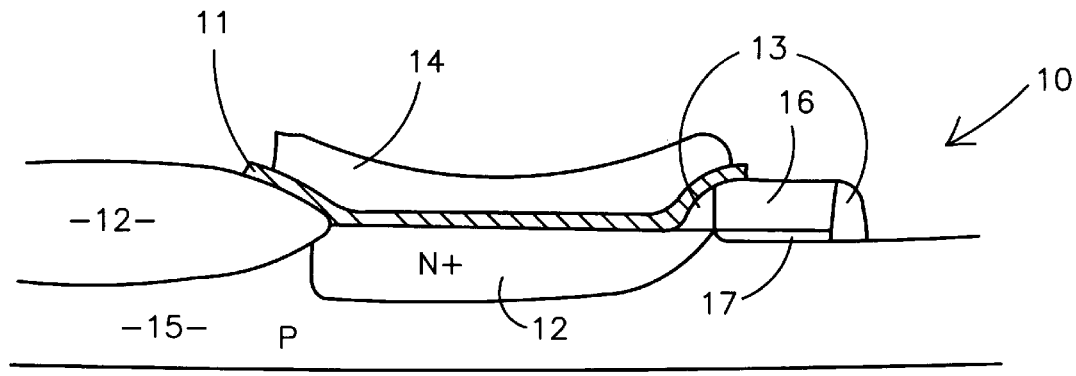
FIG. 1 is a schematic of a planar cell capacitor that includes a dielectric material and an organic isolation matrix.

The present invention is directed to capacitors, particularly to thin film capacitors (i.e., a capacitor typically having a thickness of less than about 3000 Å), used in integrated circuits, as well as other integrated circuit devices. Such capacitors include a first electrode, a dielectric material, and a second electrode. The two electrodes can be made of a wide variety of conductive materials, preferably they are made of a material (e.g., metals such as titanium, copper, and aluminum, or polysilicon) that is typically used in fabricating integrated circuit capacitors. These electrodes are typically in the form of films or "plates" of about 200–1000 Å thick, and are often positioned parallel to one another. They are referred to as the storage node electrode and the cell plate capacitor electrode. The terms "electrode," "plate," and "electrode plate" are used interchangeably herein.

A dielectric material is positioned between the two electrodes, typically in the form of a thin film of less than about 1000 Å (preferably less than about 500 Å, more preferably less than about 200 Å, and most preferably less than about 100 Å). This material is isolated from the electrodes by an organic matrix. The terms "isolated" and "isolation" mean that the dielectric material is not physically touching the electrodes, to prevent conduction paths and "shorts," but is close enough to allow the molecules to orient with the electric field generated between the two plates.

Because organic materials have a low dielectric constant. (e.g., about 2), they do not inhibit the charge build-up of the dielectric material or the electric field, however, they produce an increase in the breakdown voltage (i.e., the voltage required to cause electrical conduction between plates), which is particularly advantageous for reducing the amount of electron loss. Deposition of organic films is far easier than standard material, requiring in some situations no vacuum components, or high temperatures, which can reduce the thermal budget of wafer processing.

Preferred dielectric materials for use in the capacitors of the present invention have a dielectric constant of at least about 10. Thus, as used herein, the term "high dielectric material" refers to a material having a dielectric constant of at least about 10 (and typically at least about 50). Suitable dielectric materials can also be ferroelectric materials. Among the suitable high dielectric materials are inorganic materials such as metal oxides and metal salts. Examples of high dielectric materials include $TiO_2$, $Ta_2O_4$, $Ta_2O_5$, $WO_2$, $Al_2O_3$, $Ba_xSr_{(1-x)}TiO_3$ [BST], $BaTiO_3$, $SrTiO_3$, $PbTiO_3$, $Pb(Zr,Ti)O_3$ [PZT], $(Pb,La)(Zr,Ti)O_3$ [PLZT], $(Pb,La)TiO_3$ [PLT], $KNO_3$, and $LiNbO_3$. The most commonly used high dielectric materials are metal oxides, although the isolation techniques described herein are not limited to these materials. Furthermore, although the isolation techniques are particularly advantageous when high dielectric materials are used, these techniques can also be used with conventional dielectric materials.

Large stable organic molecules are suitable for isolating the dielectric materials discussed above. Thus, the organic isolation matrix referred to above can be formed from a variety of organic materials, such as a soluble polymer, a two-dimensional polymer, or a fullerene, for example. Preferably, the organic isolation matrix is a two-dimensional polymer or a fullerene. These organic materials can be deposited with the high dielectric material, or before and after the high dielectric material is deposited. That is, these organic materials can be in the form of layers of material deposited between the electrodes and the high dielectric material. These layers can be attached to the electrodes, as through a covalent interaction, or merely coated thereon. Alternatively, the organic material can encapsulate the dielectric material within large molecules, as discussed in greater detail below.

Fullerenes (i.e., large molecular clusters of 10 to over 100 carbon atoms), represent a third form of carbon, in addition to graphite and diamond. Fullerenes are generally spherical molecules (although they can also be in the form of tubes) represented by the following formulae: $C_{40}$, $C_{60}$, $C_{62}$, $C_{64}$, $C_{66}$, $C_{63}$, $C_{70}$, $C_{76}$, $C_{84}$, $C_{90}$, $C_{94}$, and the like. The most frequently studied fullerene is $C_{60}$. It is a large stable molecule with a truncated icosahedron structure (i.e., a soccer ball-like hollow structure). It is often referred to as "buckminsterfullerene" or just "buckyball." Preferably, $C_{40}$, $C_{60}$, and $C_{70}$ molecules (more preferably, $C_{60}$ and $C_{70}$ molecules, and most preferably, $C_{60}$ molecules) are used to isolate the high dielectric materials. Useful fullerenes can also be substituted, such as the known methylated, ethylated, and fluorinated fullerenes.

A variety of methods are known for the preparation of fullerenes. Early methods involved graphite vaporization via resistance heating in a helium atmosphere, and the formation of soot in benzene flames under oxygen-deficient conditions. More recent methods involve transforming graphite sheets into the fullerene structure. For further discussion of methods of forming fullerenes, see, for example, Curl, *Applied Superconductivity* 1, No. 7–9, Part 2, 869–878 (1993).

Metal oxides can be incorporated into fullerenes by a number of techniques. Although some of these methods may be limited to the type of metal oxide used and the type of fullerene formed, other methods are independent of the metal oxide and/or the fullerene. A preferred method incorporates the metal oxide during fullerene formation. In this method, fullerenes are formed by spiralling graphite sheets that close into the fullerene structure, as disclosed in Curl, *Applied Superconductivity*, 1, No. 7–9, Part 2, 869–878 (1993). When this method is carried out in the presence of high dielectric materials, such as metal oxides, held in the vapor phase at high temperature, the fullerenes will close around molecules of the dielectric material, thereby encapsulating the dielectric material. This method is believed to work with wide variety of dielectric materials, particularly metal oxides, and a wide variety of buckyball configurations and sizes, although the smaller fullerene molecules such as $C_{40}$ need to be matched in size with dielectric materials of relatively small molecular size.

A second method for incorporating a dielectric material into fullerenes is to prepare fullerenes by any known method. The completed fullerenes are then accelerated toward each other in the presence of the dielectric. For this method, the dielectric material can be in the vapor phase or it can be a solid. For example, the fullerene can be accelerated toward a surface of a metal oxide. Upon colliding either with a metal oxide surface or with another fullerene molecule, the fullerene cage structure opens and allows incorporation of the metal oxide. This cage-opening, phenomenon is described by Long et al., *J. Chem. Phys.* 100, 7223–7228 (1994).

A third method for incorporating a metal oxide dielectric material into fullerenes involves the electrochemical oxidation of a metal while in contact with the fullerene, thereby forming the metal oxide. This method is suitable for metal oxides that have a generally strong interaction with fullerene. For example, titanium forms a generally strong interaction with fullerenes, thereby forming titanium carbide. See, for example, Wang et al., *J. Appl. Phys.*, 79, 149–152 (1996). Because this Ti—C interaction is very strong, during electrochemical oxidation of the titanium, the fullerene is subject to incorporation of the electrochemically formed $TiO_2$ molecule.

A metal oxide encapsulated in a fullerene cage structure can be deposited on a polysilicon plate in a film thickness of about 10–100 nm, for example. The encapsulated dielectric material can be deposited in a monolayer of the fullerene cage structures, which vary in diameter from about 10 Å to about 30 Å, or in multiple layers of the fullerene cage structures. This deposition can occur during the process of encapsulating the dielectric material, or it can occur once the encapsulation has occurred. Suitable methods for depositing the dielectric material encapsulated within fullerene molecules include vacuum deposition, solution deposition using solvents such as benzene or cyclohexane, toluene or other suitable organic solvents with fullerene solubility.

A top layer (i.e., the upper electrode or plate) of polysilicon or a metal is deposited on the encapsulated dielectric material by conventional methods, such as polysilicon deposition, or physical vapor deposition (e.g., sputtering) for a metal plate, to complete the capacitor structure. Charge is accumulated by polarization of the dielectric material under a potential and stored on the outside of the fullerene cage structure. The loss of potential between the electrode plates allows the molecules of the dielectric material to rotate freely with little friction, and therefore little heat.

A second technique for isolating a dielectric material is through the use of a two-dimensional polymer. As used herein a "two-dimensional polymer" is a crosslinked deposited monolayer of a polymer which is polymerized either prior to or post deposition. Preferred two-dimensional polymers are those that are capable of forming a covalent interaction with the electrodes (or capable of being modified such that a covalent interaction is formed) and crosslinking either at or near the base of the molecules (i.e., at or near the attachment point to the electrode surface), near the middle of the molecules, or at or near the ends of the molecules once attached to the substrate surface. These two-dimensional polymers are formed by preferably attaching suitable monomers to the electrode surface and subsequently crosslinking these monomers. The crosslinking can occur as a result of reactive groups, such as acetylene, carboxy groups, amine groups, and siloxanes. Typically, the crosslinking occurs as a result of adding thermal energy to the system, although other sources of energy could be used as well. Examples of two-dimensional polymers include, but are not limited to, poly(diacetylene), poly(alkylsiloxane), and polythiols.

A two-dimensional polymer, such as poly(diacetylene), film in one or more layers can be deposited on a polysilicon plate, for example, in a thickness of about 5–50 Å, through a silicon-oxygen bond or siloxane. That is, diacetylene monomers can be modified to include siloxane groups at the ends of the molecules that allow for bond formation with the polysilicon plate (i.e., polysilicon electrode). These monomers are preferably ($C_4$-$C_{30}$)hydrocarbon monomers having at least two acetylenic moieties. Preferably, the polymer is prepared from ($C_4$—$C_{20}$)hydrocarbon monomers. More preferably, the ($C_4$—$C_{20}$)hydrocarbon monomers have two acetylenic moieties within about twenty carbons from the siloxane group. If the acetylenic groups are much further from the siloxane group than this, the hydrocarbon chains may be too "floppy" to easily crosslink. However, the closer the acetylenic moieties are to the silicon group, the longer the hydrocarbon tails formed. These tails could advantageously cover pinholes because of their "floppy" nature.

The two-dimensional polymer can be deposited in one or more layers either by Langmuir-Blodgett techniques or by vacuum deposition, as described by Shibata et al., *Proceedings of the Symposium on Electrical Insulating Materials*, 35, 247–250 (1988) and Kanetake et al., *Solid State Communications*, 56, 803–807 (1985). The deposition of acetylene on silica surfaces using the Langmuir-Blodgett techniques is typically used for passivating the silica surfaces. The Langmuir-Blodgett deposition can be enhanced by incorporating a $SiCl_3$ group into the tail end of the diacetylene monomer. This group can react with the silicon electrode surface to provide a covalent bond between the polymer and the silicon, typically through an oxygen linkage. Once deposited, the film is annealed to crosslink the diacetylene chains, as shown below.

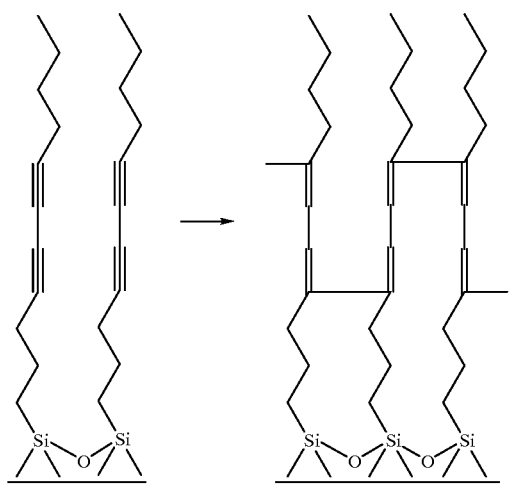

The high dielectric material is then deposited on the acetylene-modified electrode surface by a variety of methods. One preferred method is the electrochemical oxidation of a sputtered layer of metal, such as titanium. Another method involves the use of laser ablation, as in the deposition of $SrTiO_3$; however, one of skill in the art will understand that a variety of conventional techniques of depositing the dielectric material can be used. A second layer of poly(diacetylene) is then deposited by either Langmuir-Blodgett or vacuum deposition, although the $SiCl_3$ group would not necessarily be used, as there may not need to be a covalent interaction with the top electrode plate. This film is then annealed to crosslink the diacetylene monomers. A top layer (i.e., the upper electrode or plate) of polysilicon or a metal is deposited on the isolated dielectric material by conventional methods, such as polysilicon deposition, or physical vapor deposition (e.g., sputtering) for a metal plate, to complete the capacitor structure.

A third method of isolating the high dielectric material is through the use of a soluble polymer such as hydroxypropylcellulose, and other polymers that are soluble in the liquid medium. In this method, the particles of the dielectric material can be dispersed in a matrix of the soluble polymer. Thin films of this encapsulated dielectric material can then be positioned between the electrodes, which can be deposited by conventional methods as mentioned above. Particulate dielectric material can be incorporated into a soluble polymer matrix by techniques known in the art. A preferred method is to disperse the particulate dielectric material in a solution of a polymer and then coat the dispersion by known techniques, such as spin coating. One such method is disclosed by Nagpal et al., *J. Mater. Res.*, 10, 3068–3078 (1995); however, this method involves the use of very large particle sizes (e.g., 300–400 Å) and produces very thick films (e.g., 1500 Å). This method could be modified to produce thin films (e.g., 10–100 Å) by using particulate material of a particle size of about 10–50 Å, which are essentially molecular clusters.

Figure 2:
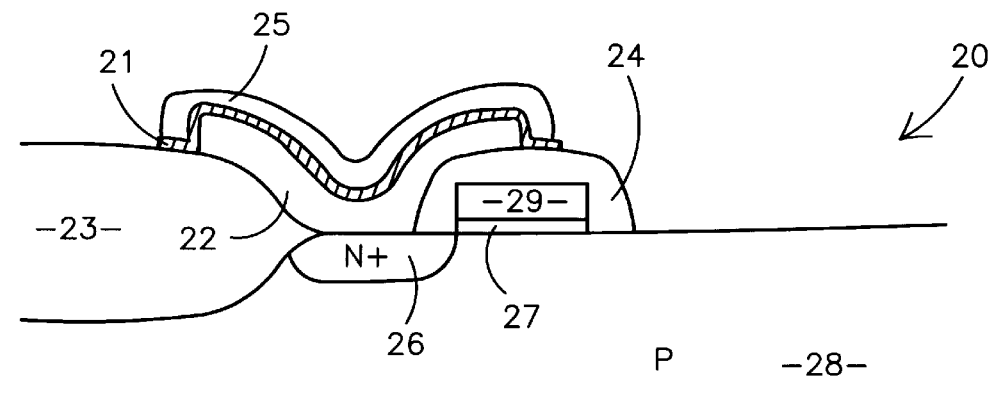
FIG. 2 is a schematic of a stack cell capacitor that includes a dielectric material and an organic isolation matrix.
Figure 3:
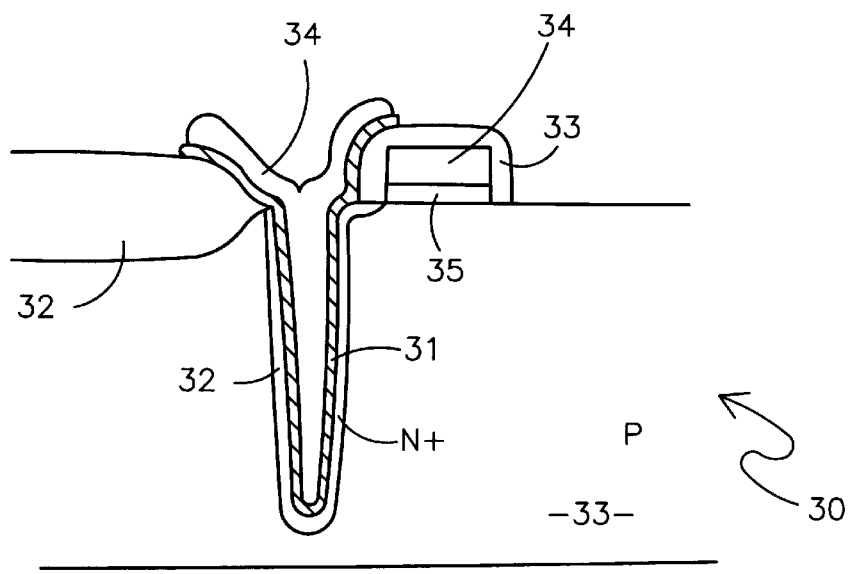
FIG. 3 is a schematic of a trench cell capacitor that includes a dielectric material and an organic isolation matrix.

The use of the organic isolation matrix, whether formed from fullerene, a two-dimensional polymer, or a soluble polymer matrix, is beneficial for a wide variety of thin dielectric applications, particularly those using high dielectric materials. For example, such applications include the dielectrics for memory cells as shown in FIGS. 1–3. The memory cells illustrated in FIGS. 1–3 include a planar cell 10, a stack cell 20, and a trench cell 30, respectively. In each of these devices the dielectric material would either be encapsulated within large molecules (e.g., fullerene), positioned between two layers of a two-dimensional polymer (e.g., poly(acetylene)), or incorporated within a soluble polymer matrix (e.g., hydroxypropylcellulose).

The planar memory cell 10 of FIG. 1, includes a high dielectric film 11 deposited on an n+-type silicon 12, which serves as the bottom plate of the capacitor. In the present invention, the high dielectric film 11 includes an organic isolation matrix in a manner desribed above depending on the organic material used. As shown, the high dielectric film 11 can also be deposited on other portions of the integrated circuit, such as the field oxide 12, and TEOS spacer 13. The polysilicon region 14 forms the top plate of the capacitor of the cell. The n+-type silicon region 12 is formed in the p-type silicon substrate 15. The other regions, not previously mentioned, used in forming the transistor of the cell include polysilicon region 16 and gate oxide 17.

The stack memory cell 20 of FIG. 2, includes the high dielectric film 21 deposited on the polysilicon layer 22, which serves as the bottom plate of the capacitor of the memory cell. In the present invention, the high dielectric film 21 includes an organic isolation matrix in a manner desribed above depending on the organic material used. As shown, the high dielectric film 21 can also be deposited on the field oxide 23, and TEOS layer 24. The polysilicon region or layer 25 forms the top plate of the capacitor of the cell. The n+-type silicon regions 26 and 27 are formed in the p-type silicon substrate 28. The other region, not previously mentioned, used in forming the transistor of of the cell include polysilicon region 29.

The trench memory cell 30 of FIG. 3, includes the high dielectric film 31 deposited on the n+-type silicon 32, which serves as the bottom plate of the capacitor. In the present invention, the high dielectric film 31 includes an organic isolation matrix in a manner desribed above depending on the organic material used. As shown, the high dielectric film 31 can also be deposited on the field oxide 32, and TEOS film or region 33. The polysilicon region 34 forms the top plate or electrode of the capacitor of the cell. The n+-type silicon region 32 is formed in the p-type silicon substrate 33. The other regions, not previously mentioned, used in forming the transistor of the cell include polysilicon region 34 and gate oxide 35.

As indicated above, the isolation techniques discussed herein are not only suitable for the memory cells illustrated above, but can be utilized for a wide variety of thin dielectric applications in integrated circuit devices. As such, the above memory cell configurations are for illustration only and are not to be taken as limiting the present invention. For example, other types of capacitors can utilize the isolation techniques described herein, such as stacked capacitors (e.g.. crown, V-cell, delta cell, multi-fingered, or cylindrical container stacked capacitors) and double sidewall trench capacitors. Examples of these types of capacitors are disclosed in U.S. Pat. Nos. 5,438,011 (Blalock et al.), 5,097,381 (Vo), 5,155,057 (Dennison et al.), 5,321,649 (Lee et al.), 5,196,364 (Fazan et al.), 5.381,302 (Sandhu et al.), and Fazan et al. (5,392,189).

Further, the present invention would also provide improved characteristics for other thin dielectric applications in integrated circuits such as, for example, a gate dielectric of a field effect transistor device. In such applications, the organic isolation matrix will isolate the dielectric material from other layers in the integrated circuit. For example, the gate dielectric of a field effect transistor device is sandwiched between n+-type silicon, which is formed on a p-type silicon substrate, and metal gates, such as aluminum metal gates.

All patents, patent documents, and publications cited herein are incorporated by reference as if individually incorporated. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of preparing a capacitor on an integrated circuit device the capacitor comprising:

(a) depositing a first material to form a first electrode;

(b) depositing a first layer of an organic material on the first electrode to form a first layer of an organic isolation matrix;

(c) depositing a layer of a high dielectric material having a dielectric constant of at least about 10 on the first layer of organic isolation matrix; and (d) depositing a second layer of an organic material on the layer of high dielectric material to form a second layer of an organic isolation matrix;

(e) depositing a second material to form a second electrode.

2. The method of claim 1 wherein the organic material comprises a two-dimensional polymer.

3. The method of claim 2 wherein depositing a first layer of an organic material comprises covalently attaching the two-dimensional polymer to the first electrode.

4. A method of preparing an integrated circuit device comprising depositing a high dielectric material having a dielectric constant of at least about 10 and an organic material in contact with the high dielectric material such that the high dielectric material is isolated by the organic material and are distinct materials; wherein the high dielectric material is deposited as a layer between two layers of the organic material.

5. A method of preparing a capacitor on an integrated circuit device, the method comprising:

(a) depositing a first material to form a first electrode;

(b) depositing a high dielectric material having a dielectric constant of at least about 10 and an organic material on the first electrode; and (c) depositing a second material to form a second electrode such that the high dielectric material and the organic material are distinct materials and the organic material comprises at least one layer between the first electrode and the dielectric material and at least one layer between the dielectric material and the second electrode.

6. The method of claim 5 wherein the organic material comprises a two-dimensional polymer.

7. The method of claim 6 wherein the two-dimensional polymer comprises poly(diacetylene).

8. The method of claim 7 wherein the poly(diacetylene) is covalently bonded to at least one of the first or second electrodes.

9. The method of claim 5 wherein the organic material comprises a soluble polymer.

10. The method of claim 5 wherein the organic material comprises fullerene molecules.

11. A method of preparing an integrated circuit device comprising depositing a high dielectric material having a dielectric constant of at least about 10 and an organic material in contact with the high dielectric material such that the organic material comprises at least two layers and the dielectric material comprises at least one layer between the layers of organic material.

12. A method of preparing a capacitor on an integrated circuit device, the method comprising:
   (a) depositing a first material to form a first electrode;
   (b) depositing a first layer of a two-dimensional polymer on the first electrode;
   (c) depositing a high dielectric material having a dielectric constant of at least about 10 on the two-dimensional polymer layer;
   (d) depositing a second layer of a two-dimensional polymer on the high dielectric material; and
   (e) depositing a second material on the second layer of a two-dimensional polymer to form a second electrode.

13. The method of claim 12 wherein the two dimensional polymer is formed by depositing monomers and crosslinking the monomers.

* * * * *